(12) United States Patent
Chen et al.

(10) Patent No.: US 10,261,643 B2
(45) Date of Patent: Apr. 16, 2019

(54) TRANSPARENT CONDUCTIVE FILM

(71) Applicant: National Tsing Hua University, Hsinchu (TW)

(72) Inventors: Hsueh-Shih Chen, Hsinchu (TW); Ming-Hua Yeh, Taichung (TW); Shih-Jung Ho, Tainan (TW)

(73) Assignee: National Tsing Hua University (TW)

( * ) Notice: Subject to any disclaimer, the term of this patent is extended or adjusted under 35 U.S.C. 154(b) by 261 days.

(21) Appl. No.: 15/402,302

(22) Filed: Jan. 10, 2017

(65) Prior Publication Data

US 2018/0067579 A1 Mar. 8, 2018

(30) Foreign Application Priority Data

Sep. 7, 2016 (TW) .............. 105128897 A

(51) Int. Cl.
| | |
|---|---|
| B32B 15/02 | (2006.01) |
| G06F 3/044 | (2006.01) |
| H05K 1/02 | (2006.01) |
| H05K 1/09 | (2006.01) |
| G06F 3/041 | (2006.01) |

(52) U.S. Cl.
CPC .............. *G06F 3/044* (2013.01); *G06F 3/041* (2013.01); *H05K 1/028* (2013.01); *H05K 1/0274* (2013.01); *H05K 1/09* (2013.01); *G06F 2203/04103* (2013.01); *G06F 2203/04112* (2013.01); *H05K 2201/0108* (2013.01); *H05K 2201/026* (2013.01); *Y10T 428/12028* (2015.01); *Y10T 428/12063* (2015.01); *Y10T 428/12424* (2015.01); *Y10T 428/24917* (2015.01)

(58) Field of Classification Search
None
See application file for complete search history.

(56) References Cited

U.S. PATENT DOCUMENTS

2015/0359105 A1* 12/2015 Yoon .................... C09D 139/02
174/268

OTHER PUBLICATIONS

Standridge et al., "Toward Plasmonic Solar Cells: Protection of Silver Nanoparticles via Atomic Layer Deposition of TiO2", Feb. 2009, Langmuir, vol. 25, pp. 2596-2600.*
Chen et al., "Thermally Stable Silver Nanowire—Polyimide Transparent Electrode Based on Atomic Layer Deposition of Zinc Oxide on Silver Nanowires", Nov. 2015, Advanced Functional Materials, vol. 25, pp. 7512-7520.*

* cited by examiner

*Primary Examiner* — Seth Dumbris

(57) ABSTRACT

The present invention discloses a novel and inventive transparent conductive film Differing from conventional metal mesh substrates are mainly constituted by silver nanowires (AgNW), the present invention particularly designs a nano metal wire consisting of a metallic core wire, a transition layer and a protection layer, and further develops a transparent conductive film consisting of a substrate and a metal mesh layer; wherein the metal mesh layer is constituted by the said nano metal wires. It is worth describing that, a variety of experimental data prove that the thermal resistance of this novel transparent conductive film is up to 400° C.; moreover, experimental data also exhibit that the transparent conductive film can filter part of blue light portion out of a white light by 20-30%.

10 Claims, 8 Drawing Sheets

TRANSPARENT CONDUCTIVE FILM

BACKGROUND OF THE INVENTION

1. Field of the Invention

The present invention relates to the technology field of silver nanowires (AgNW), and more particularly to a transparent conductive film having AgNW-made metal mesh used for replacing traditional ITO transparent conductive substrate.

2. Description of the Prior Art

It is well known that touch panels are mainly applied in the electronic devices with small screen size such as smart phone and tablet PC. However, with the growing of demands made by market on All-in-One PCs, large-scale notebooks and displays with large-size touch panel, expensive manufacturing cost and high sheet resistance of the traditional ITO transparent conductive substrate have become the major problems of the large-size touch panel. As the person skilled in development and manufacture of the transparent conductive substrates knows, traditional ITO transparent conductive substrates exhibit an average sheet resistance of 100-400 ohm/sq.

Since the high sheet resistance of the transparent conductive substrate would cause the arithmetic speed of controlling and driving circuits in the large-size touch panel be pulled down, traditional ITO substrates are considered unsuitable for being applied in the production of the large-size touch panels. Accordingly, a touch panel having at least one metal mesh layer is developed and provided. FIG. 1 shows a schematic framework view of a conventional touch panel having metal mesh layer, wherein the touch panel 1' comprises: a liquid crystal display (LCD) module 16', a first optical adhesive 15', a touch panel 10', an upper electrode layer 101', a lower electrode layer 102', a second optical adhesive 11', an anti-glare film 12', a third optical adhesive 13', and a cover lens 14'.

In the constitution of the touch panel 1', nano wires 103' for forming at least one metal mesh layer on the transparent substrate 100' of the touch panel 10' are silver nanowires (AgNW). The nano wires 103' can be formed on the transparent substrate 100' by treating an AgNW suspension (or dispersion) with a specific process of spin coating, rod coating, drop casting, or air spraying, and subsequently treating the AgNW coated onto the transparent substrate 100' with a heat process such as annealing for enhancing the conductivity of the AgNW. However, resulted from the low thermal resistance of the AgNW, the high temperature (>200° C.) annealing process leads to an abrupt increase in the sheet resistance of the nano wires 103' on the transparent substrate 100' of the touch panel 10'.

So that, in view of the AgNW-made metal mesh of the conventional touch panel 10' shows its primary drawback of low thermal resistance, inventors of the present application have made great efforts to make inventive research thereon and eventually developed a novel and inventive transparent conductive film

SUMMARY OF THE INVENTION

The primary objective of the present invention is to provide a novel and inventive transparent conductive film. Differing from conventional metal mesh substrates are mainly constituted by silver nanowires (AgNW), the present invention particularly designs a nano metal wire consisting of a metallic core wire, a transition layer and a protection layer, and further develops a transparent conductive film consisting of a substrate and a metal mesh layer; wherein the metal mesh layer is constituted by the said nano metal wires. It is worth describing that, a variety of experimental data prove that the thermal resistance of this novel transparent conductive film is up to 400° C.; moreover, experimental data also exhibit that the transparent conductive film can filter part of blue light portion out of a white light by 20-30%.

In order to achieve the primary objective of the present invention, the inventors provide one embodiment of the transparent conductive film, comprising:

a transparent substrate; and a metal mesh layer formed on the transparent substrate, wherein the metal mesh layer comprises a plurality of nano metal wires, and each of the nano metal wires comprise:
  a metallic core wire;
  a transition layer, covering the metallic core wire and being made of a metal compound; and
  a protection layer, covering the transition layer and being made of a first oxide;

wherein the thermal resistance of this transparent conductive film is up to 400° C.; moreover, the transparent conductive film is able to filter part of blue light portion out of a white light by 20-30%.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a transparent conductive film according to the present invention, embodiments of the present invention will be described in detail with reference to the attached drawings hereinafter.

Figure 2:
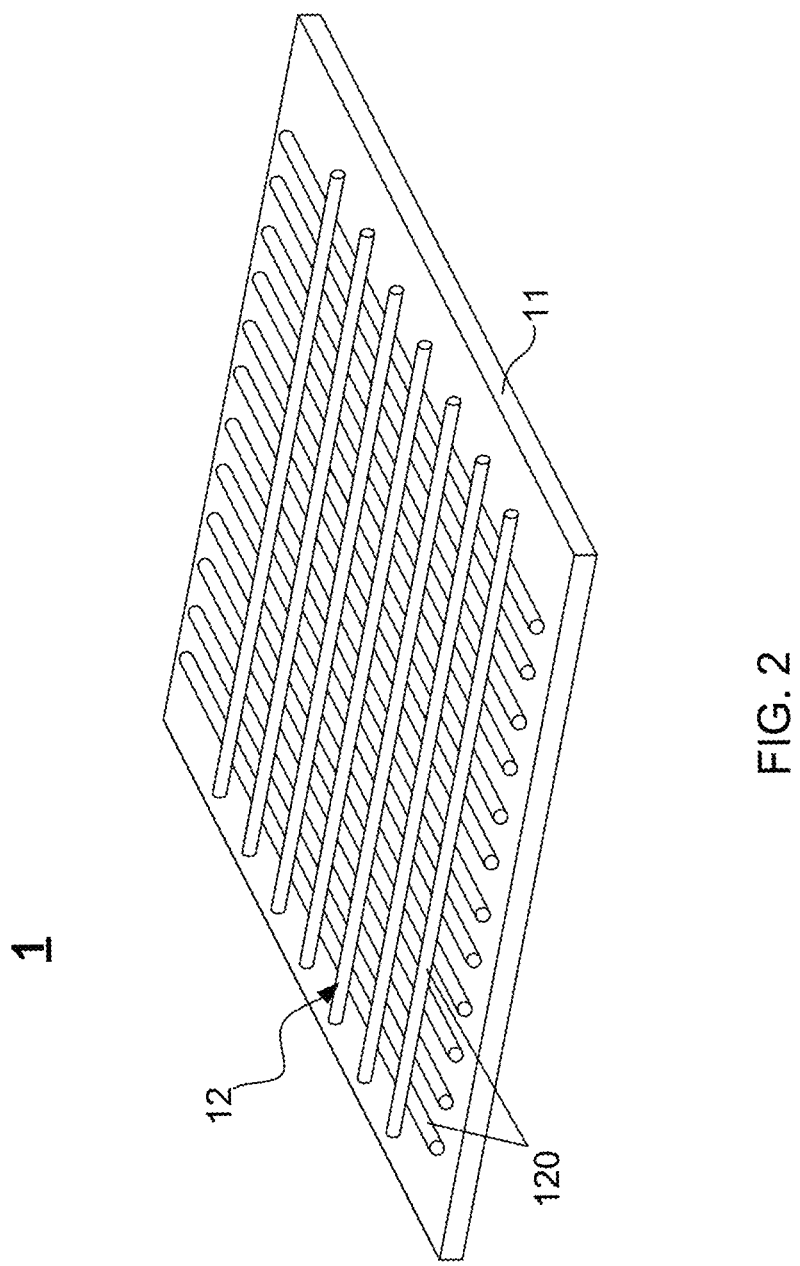
FIG. 2 shows a schematic stereo view of a transparent conductive film according to the present invention.

FIG. 2 illustrates a schematic stereo view of a transparent conductive film according to the present invention is provided. As FIG. 2 shows, the transparent conductive film 1 of the present invention mainly consists of a transparent substrate 11 and a metal mesh layer 12 formed on the transparent substrate 11, wherein the transparent substrate 11 can be a rigid substrate made of glass or a flexible substrate made of PET.

Figure 3:
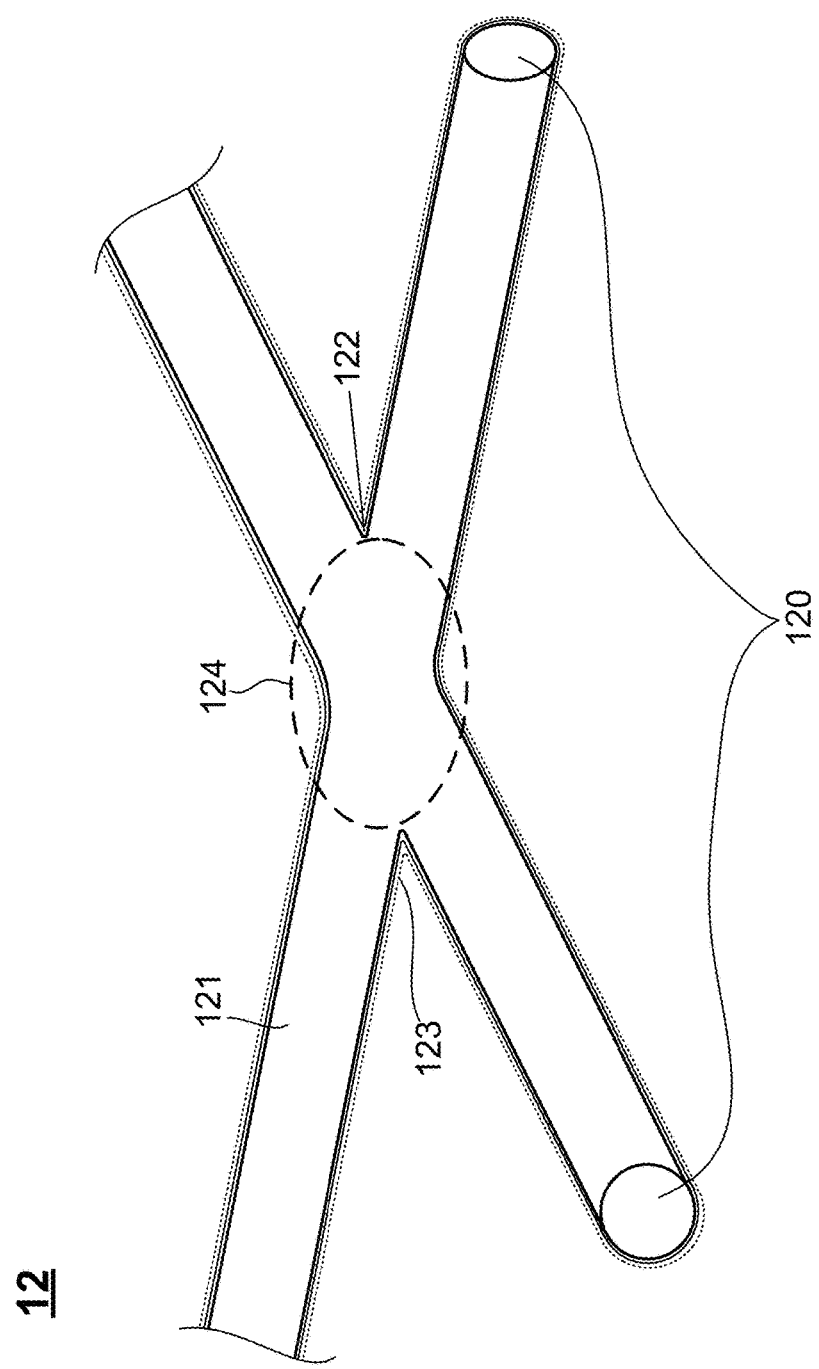
FIG. 3 illustrates a stereo diagram for showing a part of structure of a metal mesh layer.

Continuously referring to FIG. 2, and please simultaneously refer to FIG. 3, where a stereo diagram for showing a part of structure of a metal mesh layer is provided. From FIG. 2 and FIG. 3, it is able to know that the metal mesh layer 12 is constituted by a plurality of nano metal wires 120, wherein each of the nano metal wires 120 consist of a metallic core wire 121, a transition layer 122 and a protection layer 123. The said metallic core wire 121 is made of a first manufacturing material, for example, silver (Ag), gold (Au), copper (Cu), nickel (Ni), or titanium (Ti). Moreover, the metallic core wire 121 has a specific diameter ranged from 5 nm to 500 nm and a specific length ranged between 0.1 μm to 1000 μm.

On the other hand, the transition layer 122 covering the metallic core wire 121 is a metal compound. It needs to particularly explain that, the said metal compound, depending upon the discrepancy of the manufacturing process conditions, may be formed by following two groups of material composition:

(I) a metal made of a second manufacturing material, a second oxide of the metal, a PVP (Poly(vinyl pyrrolidone)), and the first oxide, wherein the second manufacturing material is same as the first manufacturing material of the metallic core wire; and (II) a metal made of a second manufacturing material, oxygen and carbon, wherein the second manufacturing material is same as the first manufacturing material of the metallic core wire.

In the constitution of the nano metal wires 120, the said protection layer 123 covering the transition layer 122 is made of the aforesaid second oxide such as titanium oxide, zinc oxide, aluminum oxide, niobium oxide, vanadium oxide, nickel oxide, cupric oxide, zirconium oxide, or indium oxide.

Figure 4A:
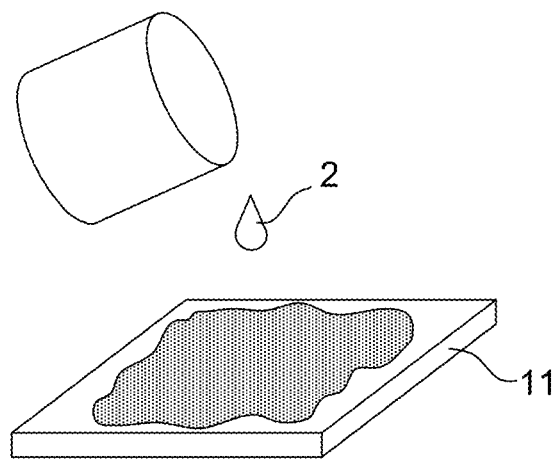
FIG. 4A, FIG. 4B and FIG. 4C show manufacturing process flow of the transparent conductive film disclosed by the present invention.
Figure 4B:
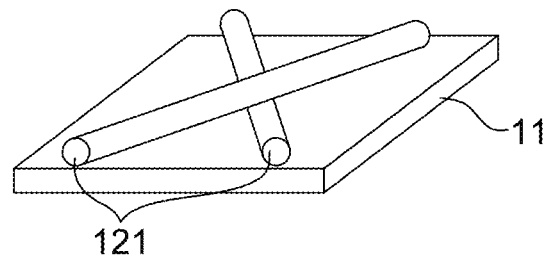
Figure 4C:
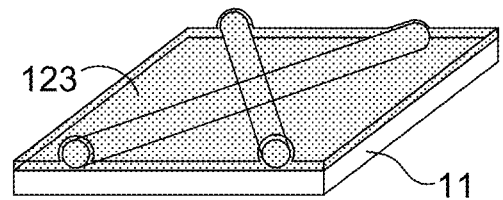

Experimental Embodiment:

Above descriptions have fully introduced the constitutions and the structure of the transparent conductive film of the present invention. In following paragraphs, experimental embodiment of the novel transparent conductive film using Ag and $TiO_2$ as the metallic core wire 121 and the protection layer 123 is provided for verifying the practicability of the transparent conductive film 1. FIG. 4A, FIG. 4B and FIG. 4C provide manufacturing process flow of the transparent conductive film disclosed by the present invention. To fabricate this novel transparent conductive film 1, silver nano wires (AgNW) dispersion 2 (or suspension) is firstly coated onto the transparent substrate 11 by using a specific process, for example, spin coating process, rod coating process, drop casting process, or air spraying process; after that, the AgNW coated onto the transparent substrate 10 is subsequently treated with a heat process such as annealing. Therefore, it can observe that the transparent substrate 10 is provided with a metal mesh layer 12 thereon, wherein the metal mesh layer 12 is formed by the metallic core wires 121. Eventually, after forming the protection layer 123 onto the transparent substrate 11 through atomic layer deposition (ALD) process, the transparent substrate 11 and the transition layer 122 are simultaneously covered by the protection layer 123.

Figure 5:
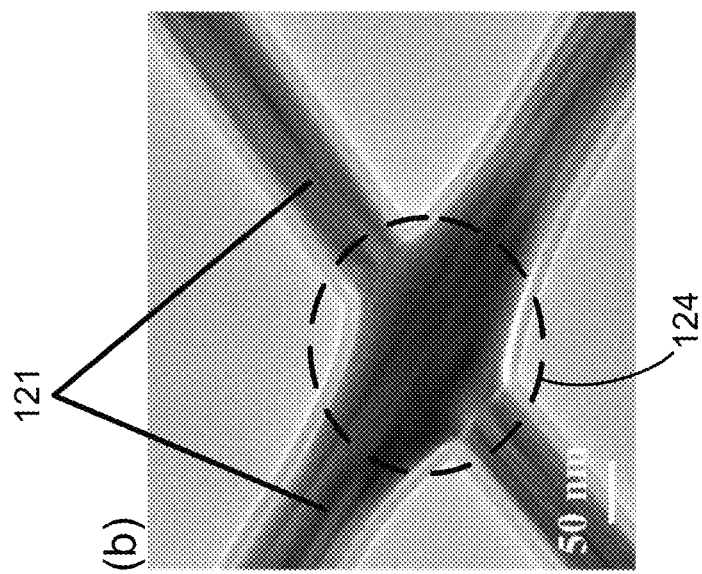
FIG. 5 shows electron microscope images of nano metal wires for forming the metal mesh layer.
Figure 5:
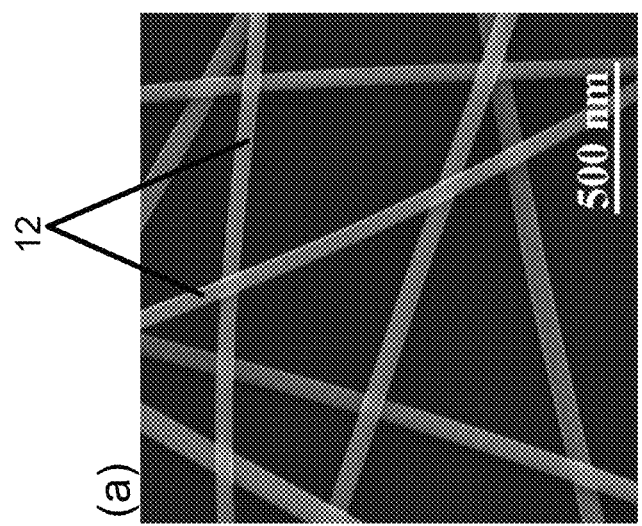

Please refer to FIG. 5, which shows electron microscope images of nano metal wires, wherein image (a) and image (b) in FIG. 5 are captured by using the electron microscope under different resolving powers of 500 nm and 50 nm. Moreover, image (b) is obtained by zoom in part of structure of the image (a). From image (b), it can clearly see any two metallic core wires 121 have an intersection nano dot 124, and the said intersection nano dot 124 has a dot size about 50-60 nm. It is worth explaining that, the inventors find that the metallic core wire 121 exhibits the best conductivity when the dot size of the intersection nano dot 124 is controlled between 20 nm and 1000 nm.

Figure 6:
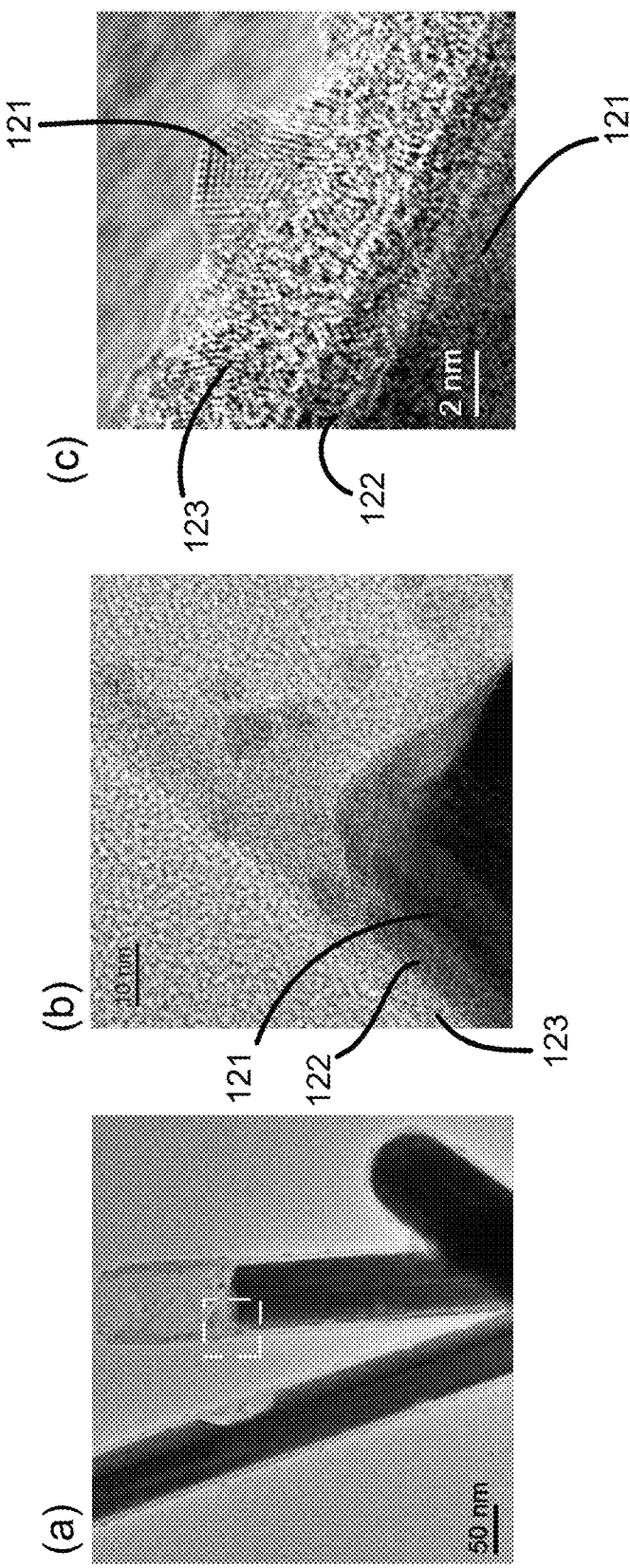
FIG. 6 shows electron microscope images of the nano metal wires.

FIG. 6 also shows electron microscope images of nano metal wires, and images (a), (c) and (c) in FIG. 6 are captured by using the electron microscope under different resolving powers of 50 nm, 10 nm and 2 nm. Moreover, image (b) and image (c) are obtained by zoom in the part of structure of the image (a) marked by a dashed rectangular framework. From images (b) and (c), it can clearly see a transition layer 122 is formed between the metallic core wire 121 and the protection layer 123. It needs to further explain that, because the AgNW dispersion 2 shown in FIG. 4A often consists of an A solution containing PVP (Poly(vinyl pyrrolidone)) and a B solution containing AgNO3, the composition of the transition layer 122 is verified as Ag—Ag2O—PVP—TiO2 after related composition analysis is completed. So that, the data of FIG. 6 have proved that the metal compound for forming the transition layer 122 is constituted by a second manufacturing material (Ag), a second oxide of the metal (Ag2O), a PVP (Poly(vinyl pyrrolidone)), and the first oxide (TiO2).

As the engineers skilled in the fabrication of AgNW know, most of AgNWs are produced by way of reducing $AgNO_3$ to silver clusters and subsequently spreading the silver clusters to silver nano wires by the use of dispersant. So that, it needs to know that the AgNW dispersions 2 supplied by different manufactures may be produced according to different composition formulas. On the other hand, the inventors find different manufacturing process conditions would make the transition layer 122 be formed by another composition distinguishing from above-mentioned AgOC; i.e., the metal compound for forming the transition layer 122 is constituted by a second manufacturing material (Ag), oxygen and carbon.

Figure 1:
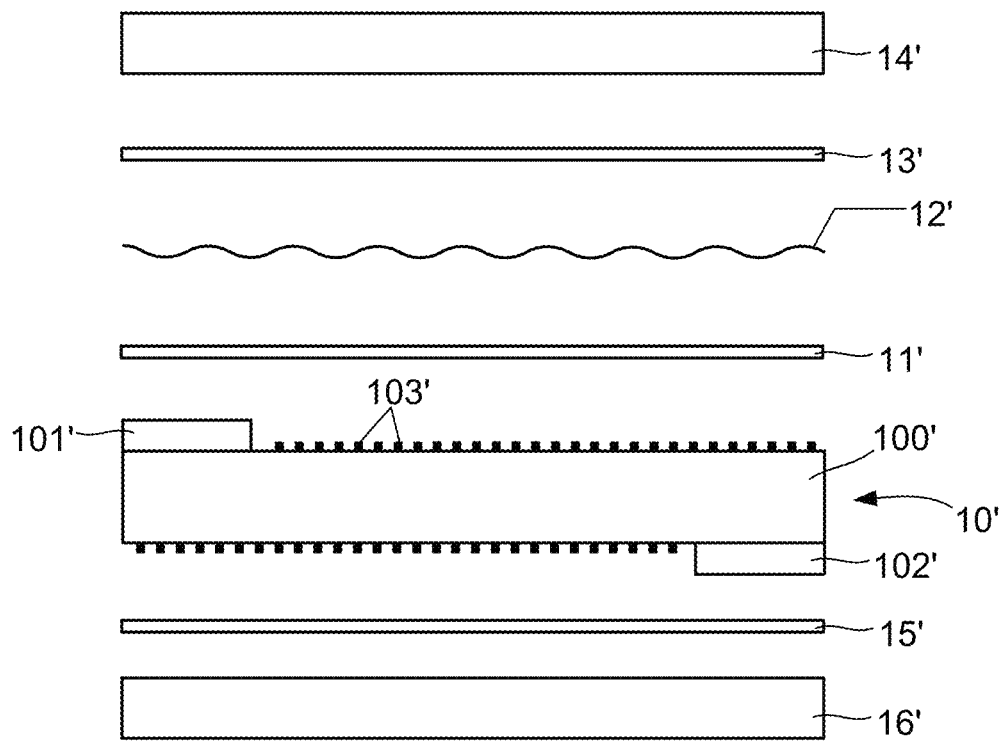
FIG. 1 shows a schematic framework view of a conventional touch panel having metal mesh layer.
Figure 8:
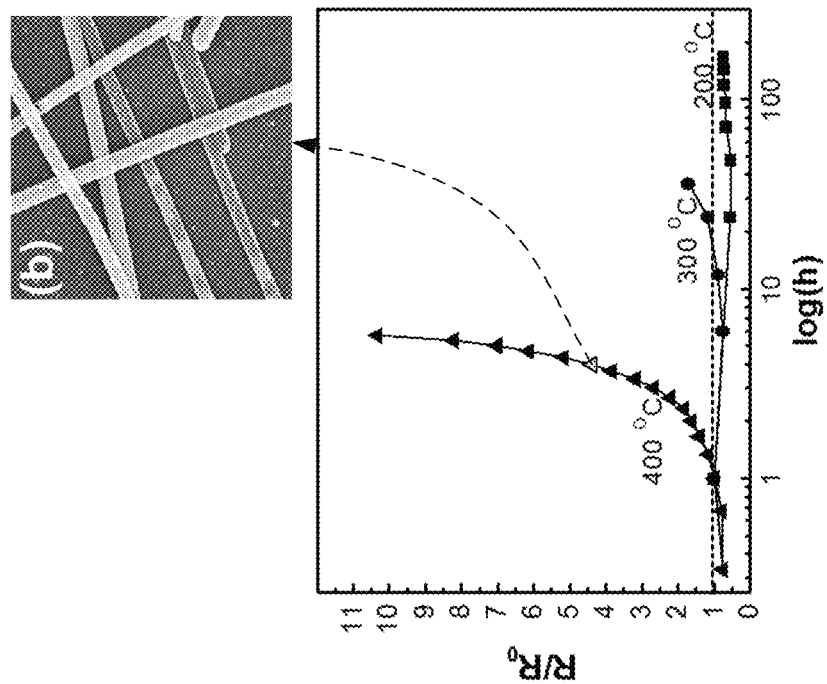
FIG. 8 shows a data curve plot of time of thermal process versus resistance ratio.
Figure 7:
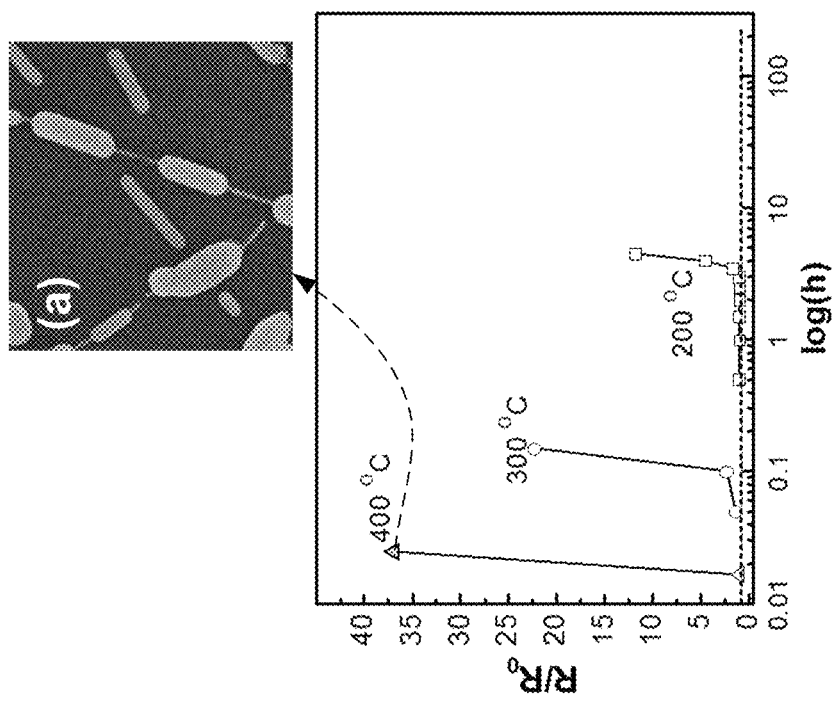
FIG. 7 shows a data curve plot of time of thermal process versus resistance ratio.

Continuously, please refer to FIG. 7, where a data curve plot of time of thermal process versus resistance ratio is provided. The data of FIG. 7 are obtained from the conventional touch panel 10' (as FIG. 1 shows) been treated with thermal process under different temperature. FIG. 8 also show a data curve plot of time of thermal process versus resistance ratio, wherein the data of FIG. 8 are obtained from the novel transparent conductive film 1 (as FIG. 2 shows) been treated with thermal process under different temperature. From FIG. 7, it can find that the high temperature (>200° C.) thermal process leads to an abrupt increase in the sheet resistance of the nano wires 103' of the touch panel 10' due to the low thermal resistance of the AgNW. On the contrary, from FIG. 8, it can find that there has no abrupt increase occurring in sheet resistance of the nano metal wires 120 even though the novel transparent conductive film 1 has been treated with thermal process under a high temperature exceeding 200° C. Furthermore, the data of FIG. 8 have proved that the thermal resistance of the transparent conductive film 1 disclosed by the present invention is up to 400° C.

Figure 9:
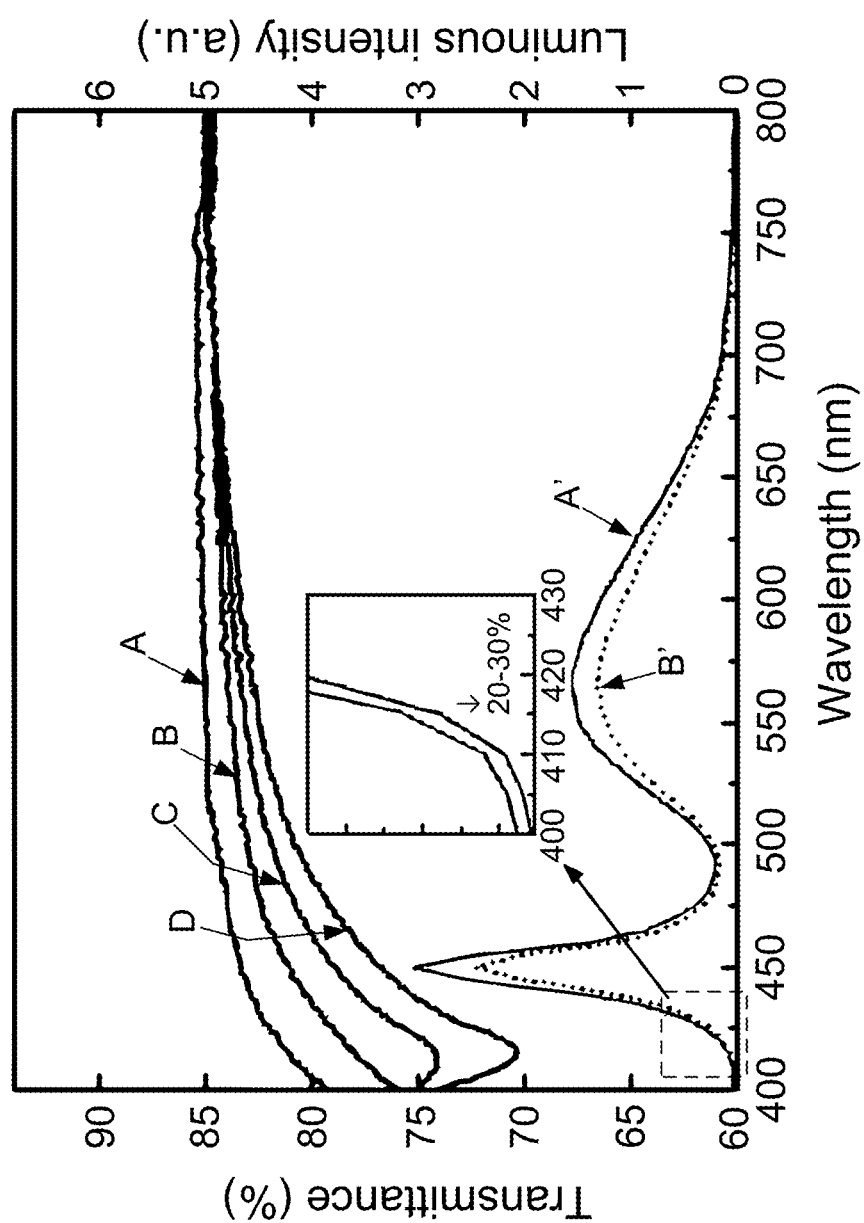
FIG. 9 shows a plot diagram including curves of wavelength versus transmittance and curves of wavelength versus luminous intensity.

Please refer to FIG. 9, which shows a plot diagram including curves of wavelength versus transmittance and curves of wavelength versus luminous intensity. The basic information of curves A, B, C, D, A', and B' are integrated in following Table (1).

TABLE (1)

| Curve | Decriptions |
|---|---|
| A | Curve of wavelength versus transmittance measured from the conventional touch panel 10' (as FIG. 1 shows), wherein at least one metal mesh layer is formed on transparent substrate 100' of the touch panel 10'. |
| B | Curve of wavelength versus transmittance measured from the novel transparent conductive film 1 (as FIG. 2 shows), wherein the protection layer 123 of the nano metal wires 120 is $TiO_2$ with 7-nm thickness. |
| C | Curve of wavelength versus transmittance measured from the novel transparent conductive film 1 (as FIG. 2 shows), wherein the protection layer 123 of the nano metal wires 120 is $TiO_2$ with 13.5-nm thickness. |
| D | Curve of wavelength versus transmittance measured from the novel transparent conductive film 1 (as FIG. 2 shows), wherein the protection layer 123 of the nano metal wires 120 is $TiO_2$ with 21-nm thickness. |
| A' | Curve of wavelength versus luminous intensity measured from a white light emitted by a conventional LED device. |
| B' | Curve of wavelength versus luminous intensity measured under the condition of using the white light emitted by the conventional LED device to illuminate the transparent conductive film 1 of the present invention. |

After finishing the data comparison between curves A, B, C, and D, it is able to find that, in spite of the transmittance of this novel transparent conductive film 1 does reduce with the increase of the protection layer's 123 thickness, the transparent conductive film's 1 transmittance still exceeds 70%. Moreover, the comparison result of curves A' and B' exhibits that the transparent conductive film can filter part of blue light portion out of the white light by 20-30%.

Therefore, through above descriptions, the transparent conductive film provided by the present invention has been introduced completely and clearly; in summary, the present invention includes the advantages of:

(1) Differing from conventional metal mesh substrates are mainly constituted by silver nanowires (AgNW), the present invention particularly designs a nano metal wire consisting of a metallic core wire, a transition layer and a protection layer, and further develops a transparent conductive film consisting of a substrate and a metal mesh layer; wherein the metal mesh layer is constituted by the said nano metal wires. It is worth describing that, a variety of experimental data prove that the thermal resistance of this novel transparent conductive film is up to 400° C.; moreover, experimental data also exhibit that the transparent conductive film can filter part of blue light portion out of a white light by 20-30%.

(2) On the other hand, besides being applied in the fabrication of the products having touch panel, this novel transparent conductive film can also replace the traditional ITO substrate to be applied in the manufacture of organic solar cells.

The above description is made on embodiments of the present invention. However, the embodiments are not intended to limit scope of the present invention, and all equivalent implementations or alterations within the spirit of the present invention still fall within the scope of the present invention.

What is claimed is:

1. A transparent conductive film, comprising:
a transparent substrate; and
a metal mesh layer formed on the transparent substrate, wherein the metal mesh layer comprises a plurality of nano metal wires, and each of the plurality of nano metal wires comprising:
a metallic core wire, being made of a first manufacturing material selected from the group consisting of silver (Ag), gold (Au), copper (Cu), nickel (Ni), and titanium (Ti);
a transition layer, covering the metallic core wire and being made of a metal compound; and
a protection layer, covering the transition layer and being made of a first oxide;
wherein the metal compound is formed by a metal that is the same as a metal in the metallic core wire, an oxide of the metal that is the same as the metallic core wire, poly(vinylpyrrolidone) (PVP), and the first oxide.

2. The transparent conductive film of claim 1, wherein the transparent substrate is a rigid substrate or a flexible substrate.

3. The transparent conductive film of claim 1, wherein the diameter of the metallic core wire is in a range from 5 nm to 500 nm, and the length of the metallic core wire is ranged between 0.1 μm and 1000 μm.

4. The transparent conductive film of claim 1, wherein the first oxide is selected from the group consisting of: titanium oxide, zinc oxide, aluminum oxide, niobium oxide, vanadium oxide, nickel oxide, cupric oxide, zirconium oxide, and indium oxide.

5. The transparent conductive film of claim 1, wherein the thickness of the oxide is in a range from 1 nm to 30 nm.

6. The transparent conductive film of claim 1, wherein the protection layer also covers the surface of the transparent substrate.

7. The transparent conductive film of claim 1, wherein the metallic core wires are formed on the transparent substrate through a specific process selected from the group consisting of: spin coating process, rod coating process, drop casting process, and air spraying process.

8. The transparent conductive film of claim 1, wherein the protection layer is formed on the transition layer through atomic layer deposition (ALD) process.

9. The transparent conductive film of claim 1, wherein any two metallic core wires have an intersection nano dot having a dot size in a range from 20 nm to 1000 nm.

10. The transparent conductive film of claim 9, wherein the thickness of the metal compound is in a range from 0.1 nm to 50 nm.

\* \* \* \* \*